United States Patent
Wong et al.

(10) Patent No.: US 8,325,068 B2
(45) Date of Patent: Dec. 4, 2012

(54) CURVE-SHAPED TOUCH-SENSITIVE KEYBOARD

(75) Inventors: Kwok Fong Wong, Hong Kong (CN); Pui Yi Ching, Hong Kong (CN)

(73) Assignee: Shining Union Limited, Hong Kong (HK)

( * ) Notice: Subject to any disclaimer, the term of this patent is extended or adjusted under 35 U.S.C. 154(b) by 389 days.

(21) Appl. No.: 12/791,570

(22) Filed: Jun. 1, 2010

(65) Prior Publication Data

US 2011/0148671 A1 Jun. 23, 2011

(30) Foreign Application Priority Data

Dec. 17, 2009 (HK) .................................. 09111885.6

(51) Int. Cl.
*H03K 17/94* (2006.01)
(52) U.S. Cl. .......................................... 341/27; 341/22
(58) Field of Classification Search .................... 341/27, 341/22, 31; 345/168, 170, 156, 173; 400/488, 400/489, 490; 200/308, 520
See application file for complete search history.

(56) References Cited

U.S. PATENT DOCUMENTS 6,869,239 B2 * 3/2005 Morris .......................... 400/488
2007/0296707 A1 12/2007 Kang et al.

FOREIGN PATENT DOCUMENTS

| CN | 1401157 A | 3/2003 |
|---|---|---|
| CN | 2884304 Y | 3/2007 |
| CN | 101098533 A | 1/2008 |
| WO | 01/52416 A1 | 7/2001 |

* cited by examiner

*Primary Examiner* — Joseph Lauture

(57) ABSTRACT

A curve-shaped touch-sensitive keyboard comprises a keyboard casing in form of a curve surface, in which upper and lower ends of the keyboard casing are warped upwards along a whole length of the keyboard casing to form two convex sections and a concave section is formed between the two convex sections; a key region disposed on an upper surface of the concave section, in which the key region is composed of a plurality of keys and each of the keys is provided with a trigger sensor; and a printed circuit board provided within the keyboard casing, in which a plurality of electronic sensors are mounted on the printed circuit board and each of the electronic sensors corresponds to one of the keys. With the present keyboard, accidental touches on the keys could be avoided effectively.

15 Claims, 5 Drawing Sheets

CURVE-SHAPED TOUCH-SENSITIVE KEYBOARD

CROSS-REFERENCE TO RELATED APPLICATIONS

The application claims the priority benefits of Hong Kong Short-Term Patent Application No. 09111885.6 filed on Dec. 17, 2009, the contents of which are hereby incorporated by reference in its entirety.

FIELD OF THE INVENTION

The present invention relates to a touch-sensitive keyboard, and more particularly to a curve-shaped touch-sensitive keyboard an outline of which is curve-shaped and the shapes of sensors on a printed circuit board thereof is specially designed, to avoid accidental touches on keys and make the keyboard possess a good input performance.

BACKGROUND OF THE INVENTION

In the current harmonious society with high-speed development, people increasingly yearn for a modernized life. High-tech products such as computers have been commonly and widely used in daily life, study and work of people. As one of the importance input devices of computers, keyboards have already been very familiar to the public. A common structure of a computer keyboard comprises keys or key caps separate from each other. The pressing and resetting of each of the keys or key caps are both realized by mechanical means whose configurations are relatively complex, and gaps between adjacent keys or key caps and gaps between keys or key caps and keyboard base are subject to accumulation of dust or other dirt which is difficult to clean. With the increasing of the dust or dirt accumulation, the sensitivity of the keyboard would be affected seriously, and the keyboard ages quickly or even is rejected directly due to failure thereof. Besides, the accumulation of dust or dirt would also affect health of users.

Nowadays, consumers are more and more fond of personalized products. However, the traditional designs of the stereotyped keyboards are monotonous, and could not satisfy the diversified desires of the consumers.

Accordingly, touch-sensitive keyboards have been developed to overcome the above shortcomings of the traditional keyboards, and could satisfy the personalized desires of consumers. The touch control function of such touch-sensitive keyboards could be realized by means of existing technology of touch pads. In particular, the touch identifications are integrally provided on a main plate of a transparent or translucent touch pad with certain rigidity to prevent from being bended. Thus, it is convenient to clean such keyboards, and is able to improve the additional value of the keyboards.

However, such technical solution is not prefect, and needs to be improved. Firstly, the most significant problem of the touch-sensitive keyboards is that it is subject to accidental touches on keys, which might lower work efficiency and cause errors in typing or operation. This disturbs users of such keyboards. Secondly, a very important performance characteristic of touch-sensitive keyboards is sensitivity of keys. Higher sensitivity and better touch performance could greatly improve feasibility and convenience of the keyboards. However, the existing touch-sensitive keyboards still need to be improved in this aspect. Especially, it is difficult to balance between sensitivity and occurrence of accidental touches. A touch-sensitive keyboard with higher sensitivity would generally result in a higher opportunity of occurrence of accidental touches. Furthermore, ergonomic design of touch-sensitive keyboards is also a subject matter pursued by the skilled in this art. Since touch-sensitive keyboards have higher trigger performance than mechanical keyboards, users of touch-sensitive keyboards could not rest their fingers on key caps during operation of the keyboards, just as operation of mechanical keyboards. In order to avoid accidental touches, users should put their fingers away from the surfaces of keyboards deliberately, which would cause the fatigue of fingers due to long working hours and affect the improvement of work efficiency.

As mentioned above, the existing computer keyboards still need to be enhanced. To overcome the above-mentioned problems in the prior art, a curve-shaped touch-sensitive keyboards are proposed.

SUMMARY OF THE INVENTION

To overcome the above-mentioned drawbacks, the present invention mainly aims to provide a curve-shaped touch-sensitive keyboard, which may comprise: a keyboard casing in form of a curve surface, in which upper and lower ends of the keyboard casing are warped upwards along a whole length of the keyboard casing to form two convex sections and a concave section is formed between the two convex sections; a key region disposed on an upper surface of the concave section, in which the key region is composed of a plurality of keys and each of the keys is provided with a trigger sensor; and a printed circuit board provided within the keyboard casing, in which a plurality of electronic sensors are mounted on the printed circuit board and each of the electronic sensors corresponds to one of the keys.

In the present curve-shaped touch-sensitive keyboard, the printed circuit board may be in form of a plate.

In the present curve-shaped touch-sensitive keyboard, a conductive insert could be provided between each of the electronic sensors and its respective key, and the conductive insert may be mounted on the corresponding electronic sensor. Gaps between the conductive inserts and the concave section may be equal to each other. A resistance of each conductive insert may be equal to that of its corresponding electronic sensor.

In the present curve-shaped touch-sensitive keyboard, each of the electronic sensors may be made of copper sheets and be in form of a rivet shape which is concave at left and right sides and convex at upper and lower sides.

In the present curve-shaped touch-sensitive keyboard, the trigger sensor may be a capacitive sensing touch pad, or a finger touch sensor which could detect touches of fingers by means of RF scanning.

In the present curve-shaped touch-sensitive keyboard, each of the keys may be provided with a light emitting diode for indicating trigger of the respective key. Or, the keyboard may be further provided with a buzzer or a sound device for indicating trigger of the keys.

In the present curve-shaped touch-sensitive keyboard, the keyboard casing may be made of plastics.

In the present curve-shaped touch-sensitive keyboard, the keyboard region may be provided with finger positioning points, and the finger positioning points may be mounted at upper edges of the keys "F" and "J". Besides, each of the keys in the key region may be provided with a concave notch.

In conclusion, the advantages and features of the present curve-shaped touch-sensitive keyboard are as follows:

1. The casing of the present curve-shaped touch-sensitive keyboard is specially designed to be of a curve shape, such as a wave shape like the letter "S" which is concave in the center while convex at upper and lower sides. Thus, the mainly key region of the keyboard could be protected, and occurrence of accidental touches on keys could be avoided effectively. Furthermore, the design of the casing is simple and useful, and it is very convenient for manufacture.

2. Conductive inserts are provided between the lamination within the present curve-shaped touch-sensitive keyboard, to couple the printed circuit board of the keyboard with the keys on the keyboard casing and transfer trigger signals therebetween. Thus, a high sensitivity could be kept for the present touch-sensitive keyboard, and working efficiency could be improved effectively.

3. The design of the outline of the present curve-shaped touch-sensitive keyboard is in conformity with principle of ergonomics. The convex sections at the opposite sides and the concave section in the center could not only avoid accidental touches on the keys, but also allow users to rest their hands on the keyboard freely to lessen fatigue of fingers due to long working hours.

4. The present curve-shaped touch-sensitive keyboard is useful, compact and of a simple structure. Its novel design could satisfy the personalized desires of current consumers.

BRIEF DESCRIPTION OF THE DRAWINGS

The present invention will be described in detail with reference to the accompanying drawings. The figures are for illustration purposes only and should not be construed as limitation to the protective scope of the present invention, in which.

LIST OF REFERENCE NUMERALS

| 100 | keyboard | 1 | keyboard casing |
|---|---|---|---|
| 11 | concave section | 12 | convex section |
| 13 | key region | 14 | printed circuit board |
| 15 | conductive insert | 16 | electronic sensor |
| 17 | finger positioning point | | |

DETAILED DESCRIPTION OF THE INVENTION

The technical features, objects and effects of the present invention will be better understood by the skilled in this art from the detailed description of the preferred embodiments of the present invention in conjunction with the accompanying drawings.

Figure 1:
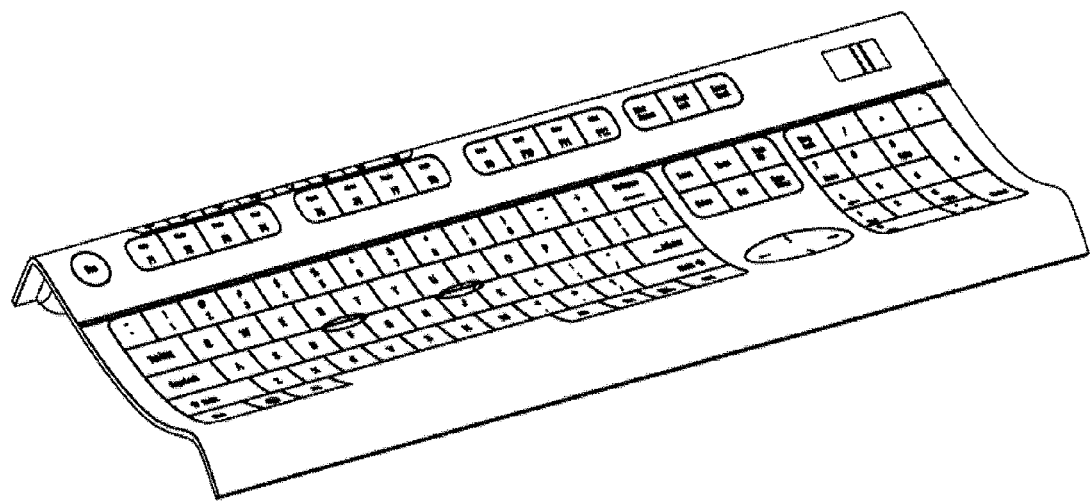
FIG. 1 is a perspective schematic view of a curve-shaped touch-sensitive keyboard according to the present invention.

With reference to FIG. 1, a perspective schematic view of the curve-shaped touch-sensitive keyboard of the present invention is illustrated. As shown in this figure, a keyboard 100 comprises a curve-shaped keyboard casing 1, and a main key region 13 provided on an upper surface of a concave section 11 of the keyboard casing 1. The key region 13 comprises a plurality of keys, and the keys are all made of touch pads with sensing function to enable to transfer trigger signals. Thus, accidental touches on the keys could be lowered or avoided effectively.

Figure 2:
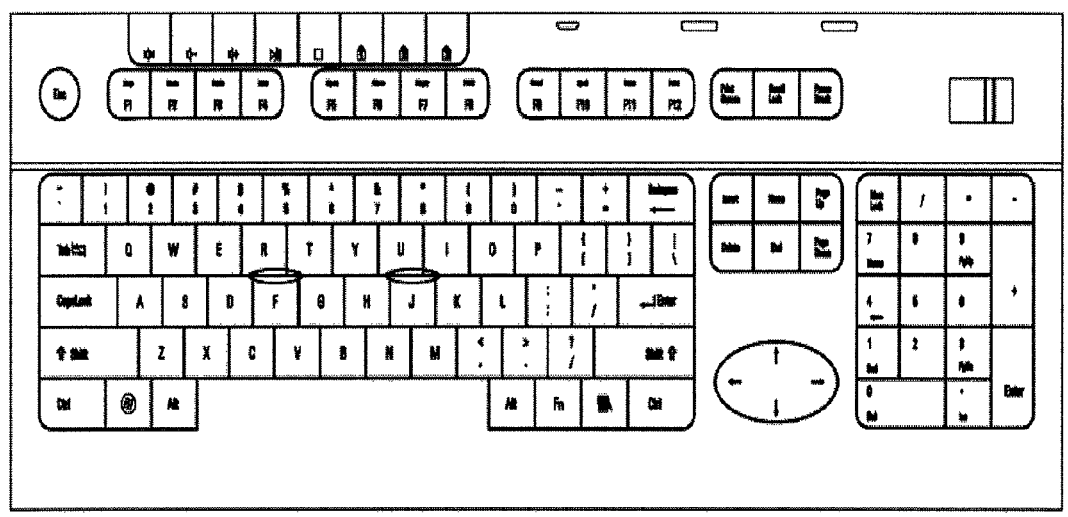
FIG. 2 is a front schematic view of the curve-shaped touch-sensitive keyboard according to the present invention.
Figure 3:
FIG. 3 is a side schematic view of the curve-shaped touch-sensitive keyboard according to the present invention.

FIGS. 2 and 3 illustrate a front schematic view and a side schematic view of the curve-shaped touch-sensitive keyboard of the present invention respectively. As shown in the side schematic view, the keyboard casing 1 of the present curve-shaped touch-sensitive keyboard 100 is in form of a continuous curve surface, and upper and lower sides of the keyboard casing 1 are warped upwards along the whole length thereof to form two convex sections 12. A concave section 11 is formed between the two convex sections 12. The outline the keyboard casing 1 in the views perpendicular to the length thereof is in form of a curve composed of the above-mentioned two convex sections 12 and the concave section 11 therebetween, just like the letter "S" or in form of a wave. As mentioned above and shown in FIG. 1, the key region 13 is disposed on the upper surface of the concave section 11. The arrangement and function of the keys in the key region 13 are similar to those in traditional keyboards. When operating the keyboard of the present invention, a user could rest his hands on the lower convex section 12 freely, thus accidental touches on the key region 13 disposed within the concave section 11 could be avoided. The keyboard casing 1 could be made of plastics with certain flexibility, to improve sense of touch and increase resistance force. The keys in the key region 13 could be in manner of trigger-type sensors, and each of the keys could be a trigger-type sensor. The trigger-type sensor could be, for example, a capacitive sensing touch pad made of conductive materials, or a finger touch sensor which could detect touches of fingers by means of RF scanning (radio frequency scanning) and then transmit trigger signals. The above configuration of the present keyboard casing could realize trigger function of the present invention, and the design thereof is in conformity with principle of ergonomics which could lessen fatigue of fingers due to long working hours.

To make the present curve-shaped touch-sensitive keyboard 100 be more convenient for use and possess even more additional value, a light emitting diode (LED) could be provided for each key in the key region 13 and is connected to a circuit. Therefore, when a finger of the user presses on a key, the LED corresponding to the key will be turn on to indicate that a trigger signal has been transmitted. LEDs could be mounted beneath or beside the respective keys, which is well known in this art and would not be described in details herein.

Furthermore, if needed, the keyboard could be provided with a buzzer or a sound device. When a key is triggered by the user, the buzzer or sound device would emit a sound to indicate that the key has been triggered successfully and a trigger signal has been transmitted.

Figure 4:
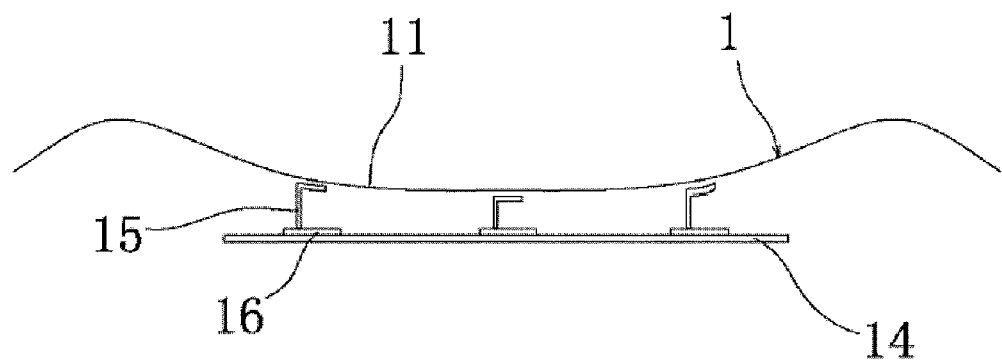
FIG. 4 is a schematic view illustrating an internal configuration of the curve-shaped touch-sensitive keyboard according to the present invention.

FIG. 4 illustrates the internal configuration of the curve-shaped touch-sensitive keyboard of the present invention. As shown in this figure, a printed circuit board (PCB) 14 is mounted within the keyboard casing 1. The trigger signals transmitted from the keys on the keyboard casing 1 would be transferred to the PCB 14 within the keyboard 100. In the present embodiment, the PCB 14 is in form of a plate. However, in other embodiments of the present invention, the PCB 14 could be of other shapes in accordance with the keyboard casing 1, especially be of a curve shape in accordance with the shape of the concave section 11. A plurality of electronic sensors 16 for receiving trigger signals are provided on the PCB 14 in accordance with the locations of the keys on keyboard casing 1. Generally, the electronic sensors of the PCB 14 are made of copper sheets, which are similar to those in PCBs of traditional keyboards.

Figure 5:
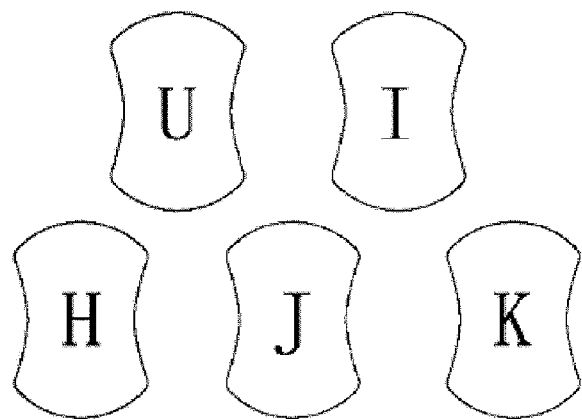
FIG. 5 is a schematic view illustrating the arrangement of part of electronic sensors on a printed circuit board of the curve-shaped touch-sensitive keyboard according to the present invention.

FIG. 5 is a schematic view illustrating the arrangement of part of the electronic sensors on the PCB of the present curve-shaped touch-sensitive keyboard. To lower accidental touches on the keys, the shape of the electronic sensors 16 on the PCB 14 of the present invention is different from a rectangle shape in the prior art. In the present embodiment, each of the electronic sensors 16 is of a rivet shape which is concave at left and right sides and convex at upper and lower sides, and the area thereof is equal to that of the rectangle shape in the prior art. With such kind of rivet shape, the lateral distance between adjacent keys could be increased to a desired distance, thus, the occurrence of accidental touches on the keys could be lowered effectively, while a high trigger sensitivity could be kept. In addition, the longitudinal distance between adjacent keys should also be large enough to avoid accidental touches.

In the present embodiment, as the concave section 11 is in form of a curve surface, while the PCB 14 is in form of a plate, the PCB 14 is almost tangent to the concave section 11, but they do not contact each other. Thus, there is a relative large gap between the PCB 14 and the concave section 11. To keep a high trigger sensitivity for the electronic sensors and avoid the deterioration of the performance characteristics of the present keyboard in detecting signals due to the aforesaid relative large gap, a conductive insert 15 could be provided on an upper surface of each electronic sensor 16. The conductive inserts 15 are mounted within the keyboard casing 1 and between the electronic sensors 16 and their respective keys. Furthermore, gaps between the conductive inserts 15 and the concave section 11 are all equal, thus the trigger signals could be transferred to the electronic sensors 16 of the PCB 14 accurately. Preferably, the resistance of each conductive insert 15 equals to that of its corresponding electronic sensor 16, to avoid affecting the performance of the whole keyboard due to the incorporation of the conductive inserts 15.

In addition, different from traditional keyboards, finger positioning points 17 of the present curve-shaped touch-sensitive keyboard are provided at upper edges of the keys "F" and "J" respectively, instead of on the keys "F" and "J" as in traditional keyboards. Thus, the operation of the present keyboard would not be affected due to the large distance between the convex sections and the PCB.

Figure 6:
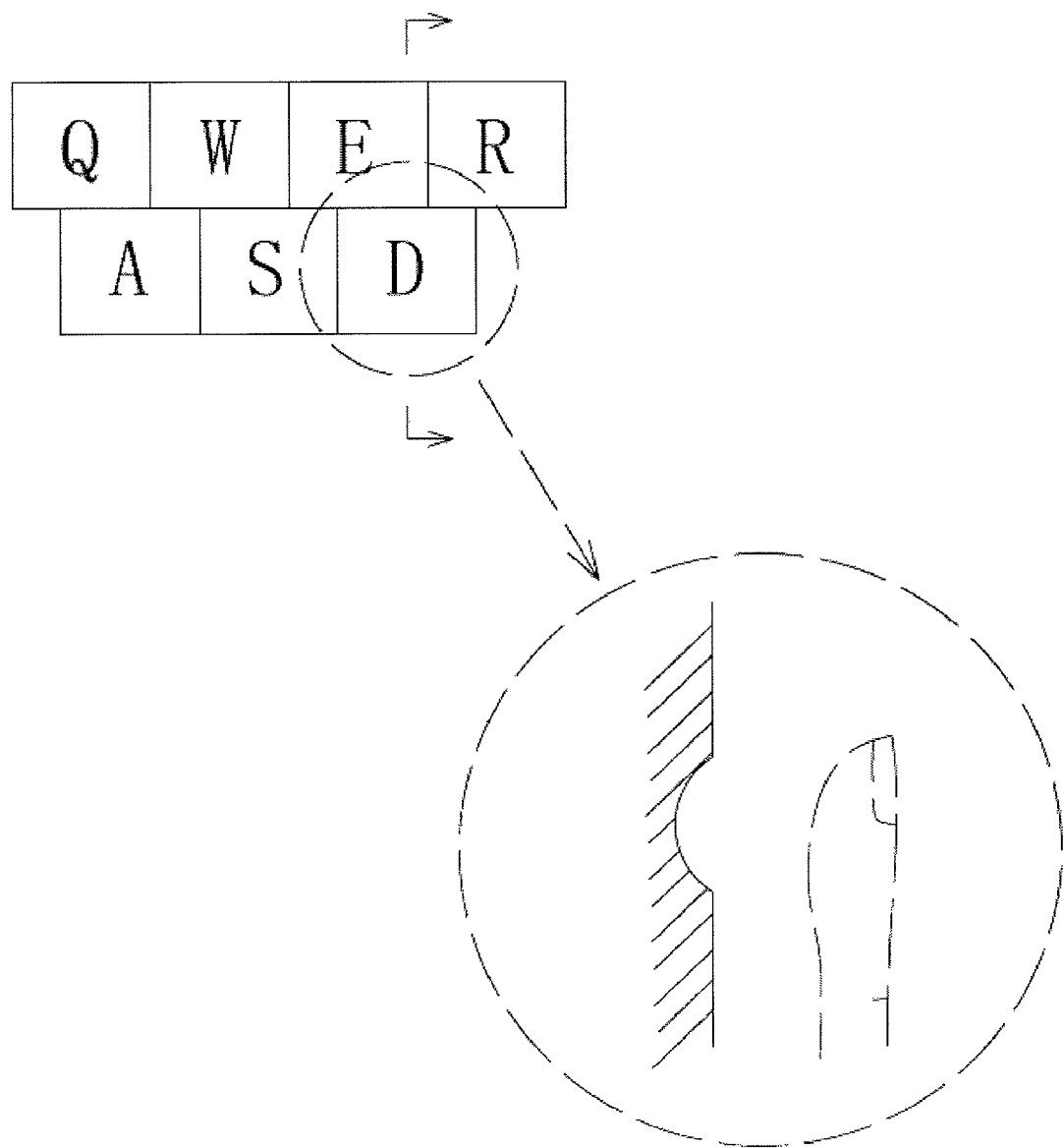
FIG. 6 is a schematic view illustrating a configuration of keys of the curve-shaped touch-sensitive keyboard according to the present invention.

FIG. 6 is a schematic view illustrating a configuration of the keys of the curve-shaped touch-sensitive keyboard according to the present invention. As shown in FIG. 6, to enable to trigger the keys more accurately and avoid accidental touches on the keys, a notch is formed into an upper surface of each key in the key region 13 of the present invention. When fingers of the user press on the keys, the notches will lead the fingers to press on correct positions, to avoid invalid trigger or accidental touches.

Although the description of the present invention is made with reference to the preferred embodiments, the present invention is not limited to these embodiments. Various modifications and changes can be made to the invention by those skilled in the art without departing from the spirit and scopes of the present invention.

What is claimed is:

1. A curve-shaped touch-sensitive keyboard comprising:
   a keyboard casing in form of a curve surface, in which upper and lower ends of the keyboard casing are warped upwards along a whole length of the keyboard casing to form two convex sections and a concave section is formed between the two convex sections;
   a key region disposed on an upper surface of the concave section, in which the key region is composed of a plurality of keys and each of the keys is provided with a trigger sensor; and
   a printed circuit board provided within the keyboard casing, in which a plurality of electronic sensors are mounted on the printed circuit board and each of the electronic sensors corresponds to one of the keys.

2. The curve-shaped touch-sensitive keyboard of claim 1, wherein the printed circuit board is in form of a plate.

3. The curve-shaped touch-sensitive keyboard of claim 2, wherein a conductive insert is provided between each of the electronic sensors and its respective key, and the conductive insert is mounted on the corresponding electronic sensor.

4. The curve-shaped touch-sensitive keyboard of claim 3, wherein gaps between the conductive inserts and the concave section are equal to each other.

5. The curve-shaped touch-sensitive keyboard of claim 3, wherein a resistance of each conductive insert is equal to that of its corresponding electronic sensor.

6. The curve-shaped touch-sensitive keyboard of claim 1, wherein a conductive insert is provided between each of the electronic sensors and its respective key, and the conductive insert is mounted on the corresponding electronic sensor.

7. The curve-shaped touch-sensitive keyboard of claim 6, wherein gaps between the conductive inserts and the concave section are equal to each other.

8. The curve-shaped touch-sensitive keyboard of claim 6, wherein a resistance of each conductive insert is equal to that of its corresponding electronic sensor.

9. The curve-shaped touch-sensitive keyboard of claim 1, wherein each of the electronic sensors is made of copper sheets and is in form of a rivet shape which is concave at left and right sides and convex at upper and lower sides.

10. The curve-shaped touch-sensitive keyboard of claim 1, wherein the trigger sensor is a capacitive sensing touch pad, or a finger touch sensor which could detect touches of fingers by means of RF scanning.

11. The curve-shaped touch-sensitive keyboard of claim 1, wherein each of the keys is provided with a light emitting diode for indicating trigger of the respective key.

12. The curve-shaped touch-sensitive keyboard of claim 1, wherein the keyboard is further provided with a buzzer or a sound device for indicating trigger of the keys.

13. The curve-shaped touch-sensitive keyboard of claim 1, wherein the keyboard casing is made of plastics.

14. The curve-shaped touch-sensitive keyboard of claim 1, wherein the keyboard region is provided with finger positioning points, and the finger positioning points are mounted at upper edges of the keys "F" and "J".

15. The curve-shaped touch-sensitive keyboard of claim 1, wherein each of the keys in the key region is provided with a concave notch.

* * * * *